United States Patent
Parkinson et al.

(10) Patent No.: US 7,983,104 B2
(45) Date of Patent: Jul. 19, 2011

(54) PAGE MODE ACCESS FOR NON-VOLATILE MEMORY ARRAYS

(75) Inventors: Ward Parkinson, Boise, ID (US); Yukio Fuji, Kanagawa (JP)

(73) Assignee: Ovonyx, Inc., Troy, MI (US)

( * ) Notice: Subject to any disclaimer, the term of this patent is extended or adjusted under 35 U.S.C. 154(b) by 0 days.

(21) Appl. No.: 12/683,735

(22) Filed: Jan. 7, 2010

(65) Prior Publication Data

US 2010/0110782 A1  May 6, 2010

Related U.S. Application Data

(62) Division of application No. 11/380,612, filed on Apr. 27, 2006, now Pat. No. 7,391,664.

(51) Int. Cl.
*G11C 7/00* (2006.01)

(52) U.S. Cl. ............ 365/222; 365/189.04; 365/189.15; 365/189.16; 365/196; 365/207

(58) Field of Classification Search .............. 365/222, 365/189.04, 189.15, 189.16, 196, 207, 230.01
See application file for complete search history.

(56) References Cited

U.S. PATENT DOCUMENTS

| | | | |
|---|---|---|---|
| 3,629,863 | A | 12/1971 | Neale |
| 3,872,492 | A | 3/1975 | Robbins |
| 5,296,716 | A | 3/1994 | Ovshinsky et al. |
| 5,818,749 | A | 10/1998 | Harshfield |
| 5,923,582 | A | 7/1999 | Voss |
| 6,501,111 | B1 | 12/2002 | Lowrey |
| 6,707,749 | B2 | 3/2004 | Ngo et al. |
| 6,795,338 | B2 | 9/2004 | Parkinson et al. |
| 2005/0169095 | A1* | 8/2005 | Bedeschi et al. ............ 365/232 |

\* cited by examiner

*Primary Examiner* — Thong Q Le
(74) *Attorney, Agent, or Firm* — Kevin L. Bray

(57) ABSTRACT

An array of non-volatile memory cells arranged in logical columns and logical rows, and associated circuitry to enable reading or writing one or more memory cells on a row in parallel. In some embodiments, the array of memory cells may include a phase change material. In some embodiments, the circuitry may include a write driver, a read driver, a sense amplifier, and circuitry to isolate the memory cells from the sense amplifier with extended refresh.

19 Claims, 13 Drawing Sheets

PAGE MODE ACCESS FOR NON-VOLATILE MEMORY ARRAYS

RELATED APPLICATION INFORMATION

This application is a divisional of U.S. patent application Ser. No. 11/380,612 filed Apr. 27, 2006, now U.S. Pat. No. 7,391,664, the disclosure of which is incorporated by reference herein.

FIELD OF THE INVENTION

The invention relates generally to techniques for accessing an array of memory elements, and more particularly to accessing an array of non-volatile memory elements using sequential or parallel memory array accesses.

BACKGROUND OF THE INVENTION

"Dynamic memory" generally refers to computer memory that retains information stored for only a brief period of time before requiring a "refresh," wherein a parallel set of bits on a selected row line of the memory is read and then re-written with precisely the same data unless a write cycle is also initiated during the access cycle. A common example is dynamic random access memory ("DRAM"). "Non-volatile memory" generally refers to computer memory that can retain the stored information when no power is applied and without frequent refreshes. Examples of non-volatile memory include, but are not limited to, static random access memory ("SRAM"), mask-programmed read-only memory ("ROM"), programmable ROM, magnetic RAM, and flash memory.

"Writing" a particular bit into the memory means to drive the bit to a predetermined logic state, also called a data value. In memory capable of storing one of two states, the states may be referred to as "set" and "reset," commonly referred to as one and zero respectively. "Reading" the state of a particular bit in memory means to determine the state previously written. Reading, writing, or refreshing are generally called "accessing" the memory. Memory may be sequentially accessed, meaning that the stored data must be accessed in a predetermined order, or randomly accessed, meaning that the stored data may be accessed in any order, including sequentially. Examples of non-volatile memory that are sequentially accessed include disk drives and tape drives, and will be referred to herein as "non-volatile storage." For the remainder of this discussion, "non-volatile memory" will refer to randomly accessible memory ("RAM"), even when such memory supports sequential accesses as an alternative.

Randomly accessible memory is often implemented as a "memory array," wherein the individual data bits are organized in logical columns and logical rows. A bit of data may be read from the array by examining the state of the bit at the intersection of a particular logical column and a particular logical row. Likewise, a bit may be written by forcing a bit to a pre-selected state. The logical columns and rows constituting the array may be assigned numbers, called addresses, so that each bit in the array may be identified by the combination of its column address and row address selecting the bit.

A decoder is an electronic circuit containing combinatorial logic that converts binary information from 'n' inputs to 2^n unique outputs. In memory array applications, an address decoder is used to select the row and column lines corresponding to a memory bit to channel the read or write current and voltage to the selected memory cell or cells. The address decoder operates by converting an 'n' bit binary number representing the address of a single bit to single column line or a single row line. In some applications where only a limited portion of the address changes in accessing bits, the address may be refer to a nibble (4 bits), byte (8 bits), word (8, 16, or more bits), or larger sets of bits; accordingly, the address decoder may be designed to select multiple rows, or one or more column lines for a selected row, that correspond to the desired set of bits.

A memory array may be implemented as an integrated circuit, also called a microchip, chip, or die, collectively referring to a miniaturized electronic circuit manufactured on the surface of a thin substrate of semiconductor material. A memory array may also be implemented on a hybrid integrated circuit: a miniaturized electronic circuit constructed of components bonded to a substrate or circuit board. Fine wires or leads are used to interconnect circuit components and the substrate or circuit board. Bonding is the process of connecting together the metal lands on the integrated circuit and the fine wires used to communicate with other circuit components.

Conductors are used to interconnect circuit elements in an integrated circuit. These conductors may be made of metal, metal alloys, or metal mixtures, all referred to as "metal" or electrodes herein. Other conductive or resistive materials may also be used to interconnect circuit elements, such as, but not limited to, polysilicide.

In a physical manifestation of a memory array on an integrated circuit, conductors addressed as column lines and row lines interconnect the bits and are used to select individual bits in the array. Often, form follows function, and the physical array follows its logical layout: the bits are physically arranged in rows and columns, with column lines and address lines arranged orthogonally. In some cases, however, the physical characteristics of the devices or packing density considerations dictate the physical layout, and the logical relationships are not easily ascertainable by examining the physical layout of the array. In this document, "logical row" and "logical column" denote the arrangement of memory elements as they are addressed, without regard to the actual physical relationship of memory elements. "Row" or "column" may denote either a logical or physical row or column, or both, depending on the context. In DRAM, refreshes are typically performed by selecting a memory row, reading, and the row line may be physically located below, above or adjacent to a column line.

In DRAM, refreshes are typically performed by selecting a memory row, reading all bits on the row in parallel, then re-writing the same data in parallel unless the bits were modified while the row is accessed, all in the same cycle row address cycle. The selection of a memory row and the row address cycle is typically signaled by assertion of a row address select (RAS) signal. Generally, ordinary read and write access must be delayed while a refresh cycle is occurring. This delay is often referred to as "stealing cycles," and is considered overhead, with less percentage time required for refresh being generally considered as more efficient memory. The refresh cycle may be modified so that data may be read or altered in accordance with a write cycle initiated during the refresh cycle; that is, a read or write cycle may serve to refresh a row accessed or a refresh cycle may be used to fetch or read data.

DRAM may be accessed via "page mode," wherein a single row is selected for a series of accesses made by varying the column address in either a sequence or to random column addresses. This technique eliminates delay in accessing the row for each successive column address, improving access speed when reading or writing bursts of data. Depending on the implementation, the length of the access may vary from a few bits to the entire row.

A "cache" is often used in computer systems, wherein data stored in a relatively slow form of memory may be duplicated in cache for high speed access by a computer. Once data is stored in the cache, future accesses may be directed to the cache rather than to the source of the original data, so that average access time is lower.

Some DRAM supports "video mode" accesses and is particularly useful to support raster graphics systems. In a raster graphics system, the video memory is called upon to constantly refresh a raster display, and at the same time be responsive to modifications from the host processor. Without using video mode, the host processor must contend with other hardware that is reading the memory to refresh the display. Each host processor access may be held up for several cycles, which becomes relatively expensive as overhead, just as stealing cycles for refresh increases overhead. Employing video mode memory eliminates this contention and reduces overhead load on the processor used to drive the display. Generally, such memory has two input/output ("I/O") ports: a port for accesses by a host processor, and a port for accesses by video hardware. The video port often supports sequential page mode accesses where, for example, 1024 bits in a selected memory row are accessed and loaded in parallel into a shift register. Then, the shift register may be clocked and shifted at the video display speed to refresh a row on the display. Once complete, another row may be loaded from the processor. Video mode may support a format of one or more bits per clock cycle, with one or more parallel output bits on the video port.

Although video mode accesses are particularly useful for raster graphics systems such as displays for computers, video mode may be useful in many other applications, including printers, cameras, and digital signal processing.

The purpose of the foregoing Abstract is to enable the public, and especially the scientists, engineers, and practitioners in the art who are not familiar with patent or legal terms or phraseology, to determine quickly from a cursory inspection, the nature and essence of the technical disclosure of the application. The Abstract is neither intended to define the invention of the application, which is measured by the claims, nor is it intended to be limiting as to the scope of the invention in any way.

Still other features of the present invention will become readily apparent to those skilled in this art from the following detailed description. As will be realized, the invention is capable of modification in various obvious respects as will be apparent to those reasonably skilled in the art, and all without departing from the invention. Accordingly, the drawings and description are to be regarded as illustrative in nature, and not as restrictive in nature.

DESCRIPTION OF THE PREFERRED EMBODIMENTS

Figure 1:
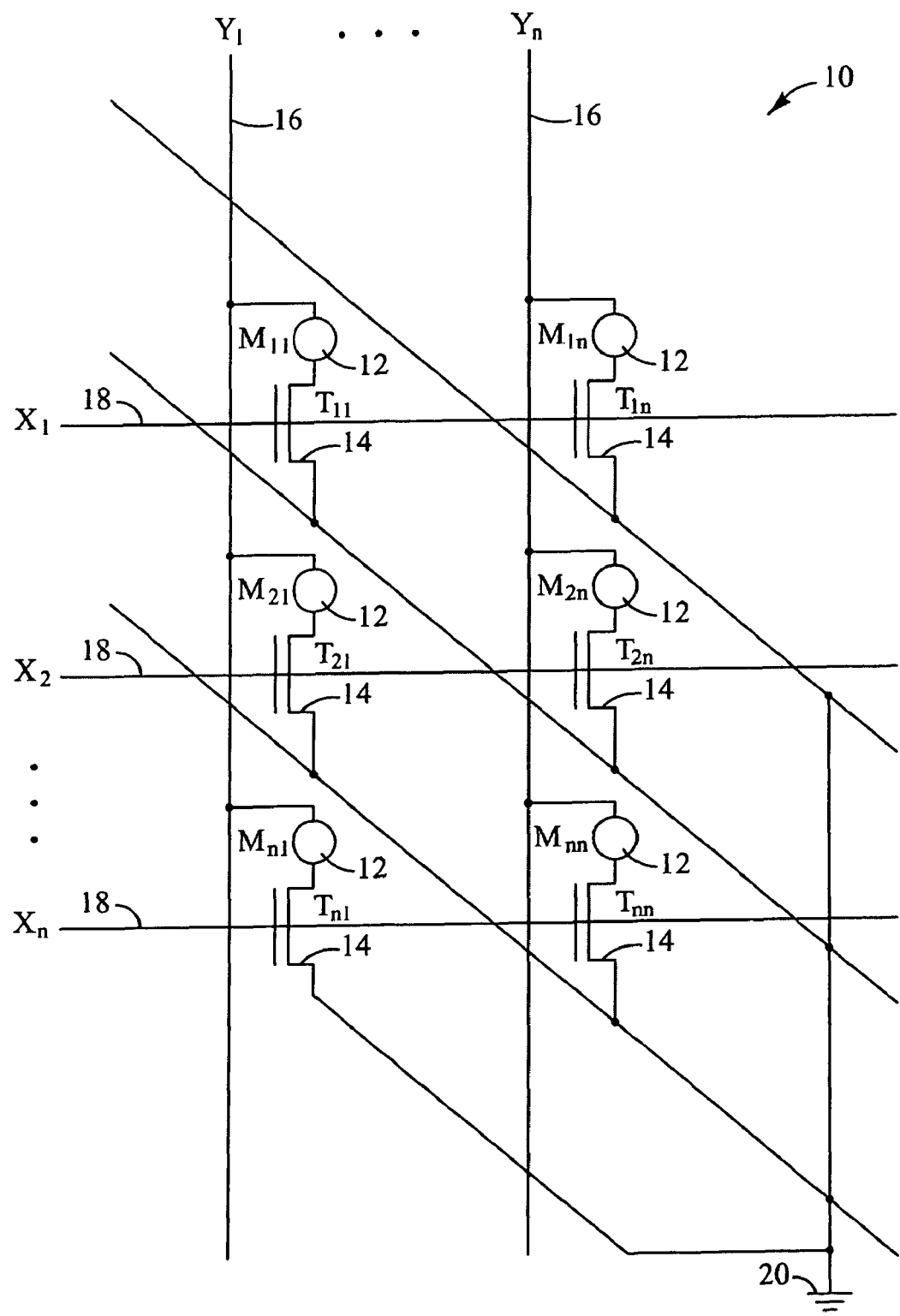
FIG. 1 is a schematic diagram of an embodiment of a memory array.

While the invention is susceptible of various modifications and alternative constructions, certain illustrated embodiments thereof have been shown in the drawings and will be described below in detail. It should be understood, however, that there is no intention to limit the invention to the specific form disclosed, but, on the contrary, the invention is to cover all modifications, alternative constructions, and equivalents falling within the spirit and scope of the invention as defined in the claims.

Page mode and video mode accesses of non-volatile memory may significantly improve access speed over bit by bit accesses, and may allow the use of non-volatile memory in applications previously reserved for dynamic memory. Circuitry may be provided to enable page mode and video mode accesses of non-volatile memory arrays. This circuitry may be configured to reliably read and write the specific type of memory technology employed, and is necessarily different than prior art techniques applied to DRAM. However, use of page mode and video mode accesses often require careful attention to the conduction of read and write currents to ground to prevent parasitic voltage drops from introducing errors.

In the following description and in the figures, like elements are identified with like reference numerals. The use of "or" indicates a non-exclusive alternative without limitation, unless otherwise noted.

FIG. 1 depicts an embodiment of an array 10 of non-volatile memory elements 12 arranged in a logical array of n columns and n rows. For clarity, both the row lines and address lines are designated 1 through n. However, there is no requirement that the number of rows match the number of columns. Memory array 10 and the associated circuitry shown in the following figures may be implemented on an integrated circuit or as a hybrid integrated circuit. Memory array 10 may be constructed using semiconductor or thin film techniques.

To illustrate the operation of array 10, phase-change memory elements are depicted. However, other non-volatile memory technologies may be used, such as, but not limited to, flash memory or magnetic random access memory.

Phase change memory may use an ovonic or chalcogenide material. Embodiments of ovonic memory devices and ovonic select devices are described in U.S. Pat. No. 6,795,338 to Parkinson, et. al., incorporated herein by this reference. In an ovonic memory, a small volume of chalcogenide alloy, called a cell, is integrated into a memory circuit. Upon application of a pre-defined write signal, the cell undergoes a reversible phase change between an amorphous state having high resistivity and a crystalline state having low resistivity. The data stored in the cell may be read, for example, by measuring the cell's resistance and variations thereof.

When using a phase-change memory, the resistance of the memory element 12 may be measured to determine the state of the stored bit. The resistance may be measured by either forcing a pre-selected voltage, such as less than Vth, and measuring the resulting current, or forcing a pre-selected current, such as less than Ith, and measuring the resulting voltage. Alternatively, the state may be determined by measuring the current or voltage switching threshold of the memory element 12. For example, the switching threshold may be measured by applying a varying voltage to memory element 12, measuring the resulting current, and determining the voltage at which the current varies non-linearly.

Each memory element 12 is connected to select switch 14. Memory elements 12 common to a particular column are interconnected by a column line 16. The set of column lines 16 are designated Y1 through Yn. Each select switch 14 has a control input that is connected to a row line 18, designated X1 through Xn, and a connection to system ground 20. Thus, each memory element 12 and its corresponding select switch 14 may be designated by an x-y coordinate. For example, the memory element 12 and select switch 14 at the intersection of column Y1 and row X1 are designated M11 and T11, respectively. An array having 1 through n rows and 1 through n columns contains memory elements M11 through Mnn. Column lines 16 may also be referred to as "bit lines," and row lines 18 as "word lines." Column lines 16 and row lines 18 may be collectively referred to as "address lines."

Select switch 14 may be used to select memory element 12 for read or write. Select device 14 may be operable as a switch that is either "off," meaning a substantially electrically non-conductive state, or "on," meaning a substantially conductive state. In the embodiment shown in FIG. 1, each select switch 14 is an n-channel field effect transistor ("FET"), designated T, with the drain connected to a memory element 12, the source connected to system ground 20, and the gate connected to a row line 18. Without limitation, select switch 14 may be constructed using metal-oxide-semiconductor ("MOS") processes. In operation, when a voltage higher than the threshold voltage of select switch 14 is applied to the gate by row line 18, select switch 14 is turned on allowing voltage to be applied across and electrical current to pass through memory element 12. When a voltage lower than the threshold voltage is applied to the gate, select switch 14 is turned off, blocking electrical current through memory element 12 to be less than the select switch 14 leakage current.

While n-channel select transistors are shown in FIG. 1, other types of select switches may be used, either as replacements for or in combination with the n-channel transistors shown. Without limitation, select switch types include p-channel FETs, SCR, or bipolar transistors, along with corresponding changes in bias and signal and power supply polarities. Select devices may also include an MOS or bipolar diode or an ovonic material, such as a chalcogenide alloy ovonic threshold switch (OTS) that reversibly changes resistance upon the application of appropriate electrical voltage, current, heat, light, or other form of energy, as are familiar to those reasonably skilled in the art.

A technique for programming a phase change memory cell is to apply a pulse of current to the cell at a voltage greater than the switching threshold for the phase change material and with a fast quench or trailing edge (e.g. less than 10 nsec), leaving the cell material in the "reset" state (amorphous and high resistivity). Application of a subsequent pulse at a voltage greater than the switching threshold, but with a slow trailing edge (e.g. greater than 500 nsec), changes the material to the "set" state (crystalline and low resistivity). The reset pulse generally has a higher energy than the set pulse, so that the temperature of the phase change material is raised to Tm, the amorphizing temperature, before the material is rapidly cooled down and left in the amorphous state. The rapid cool-down may be achieved through use of a fast pulse trailing edge or a quench transistor to pull down the column line rapidly, less than one nanosecond in some embodiments.

Figure 2:
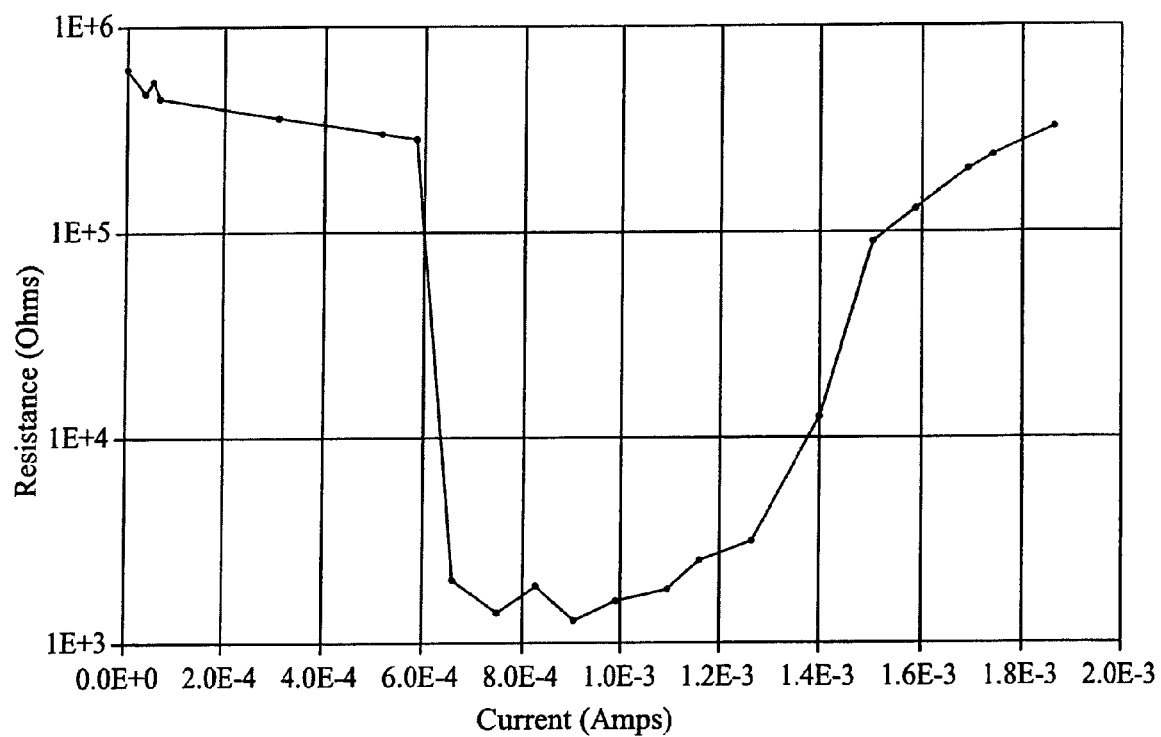
FIG. 2 illustrates the current-resistance characteristics of an exemplary phase change memory cell.

To set the cell material to the crystalline state, the set pulse raises the cell material to a lower optimum temperature, Topt, allowing the material to crystallize in a relatively short time interval. The magnitude, shape, and duration of the set and reset pulses may be adjusted to achieve the target temperatures. FIG. 2 shows the resistance (y-axis) of a typical ovonic memory cell after applying pulses of varying current magnitudes (x-axis). The resistance varies from approximately 2 k ohms to over 200 k ohms depending on the pulse applied.

Figure 3A:
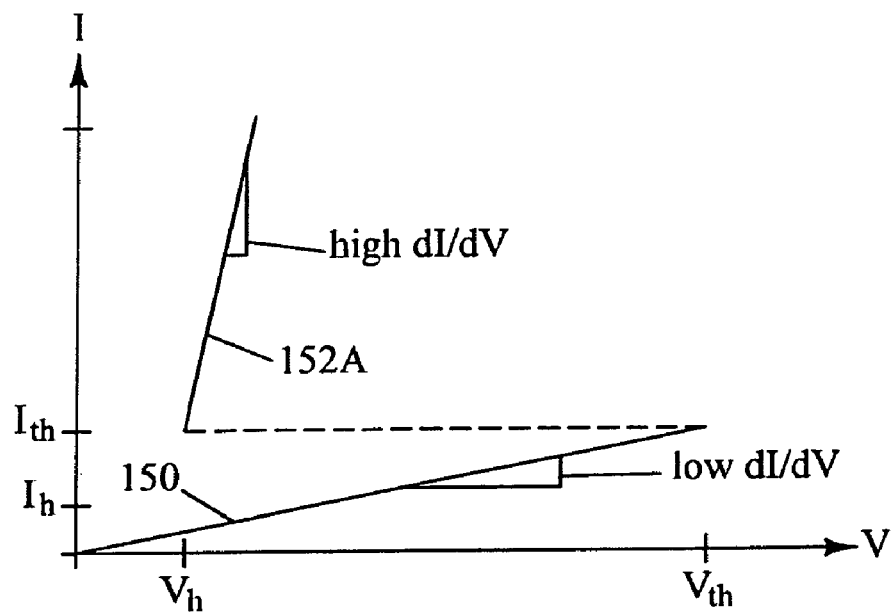
FIG. 3A illustrates the voltage-current characteristics of a reset phase-change memory cell.
Figure 3B:
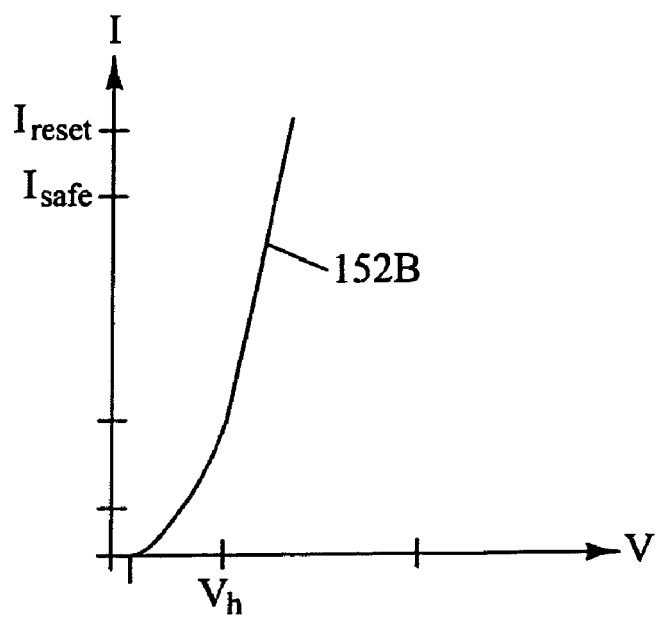
FIG. 3B illustrates the voltage-current characteristics of a set phase-change memory cell.

FIGS. 3A and 3B show the current-voltage ("IV") curves for an idealized ovonic memory cell. FIG. 3A depicts the reset state; FIG. 3B depicts the set state. Referring to FIG. 3A, as increasing voltage is applied (x-axis) the current through the cell increases (y-axis) at a relatively low slope (low dI/dV) shown by reset curve 150, corresponding to a relatively high dynamic resistance of a reset bit. When the applied voltage is increased to Vth, the cell switches to the relatively low dynamic resistance, set state having a relatively high slope (high dI/dV) shown by the portion of the reset curve 152A. The voltage increases slowly along this lower resistance curve for currents increasing above Ith or above. For the purposes of illustration, some ovonic cells have a threshold voltage of about one volt and Ith of 10 microamps.

Referring to FIG. 3B, showing the set state, voltage across the cell varies non-linearly with the applied current until reaching approximately Vh. As the voltage across the memory cell exceeds Vh, the dynamic resistance transitions to be about the same slope as shown at 152A (FIG. 3) for a reset bit that is operating above the threshold current, Ith. The set bit may undesirably increase in dynamic resistance (dI/dV) during read if current is applied at or above Isafe with a fast trailing edge. Therefore, read current amplitude may be set to less than Isafe, or preferably less than 30% of the minimum Ireset current. At currents above Ireset, the cell will be reset, and these currents are usually allowed only during a write cycle.

Figure 4A:
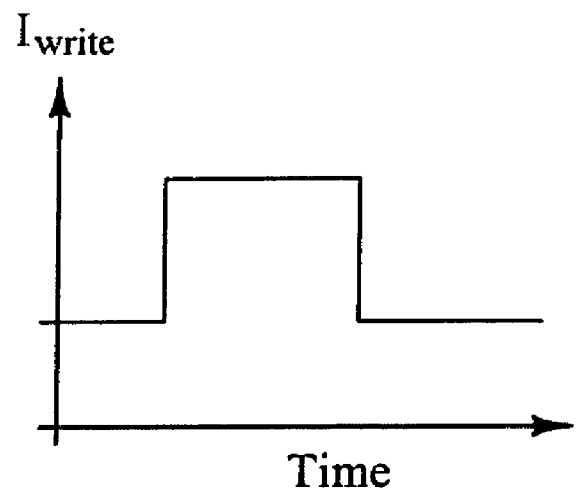
FIG. 4A illustrates a reset write pulse for writing a phase change memory cell into the reset state.
Figure 4B:
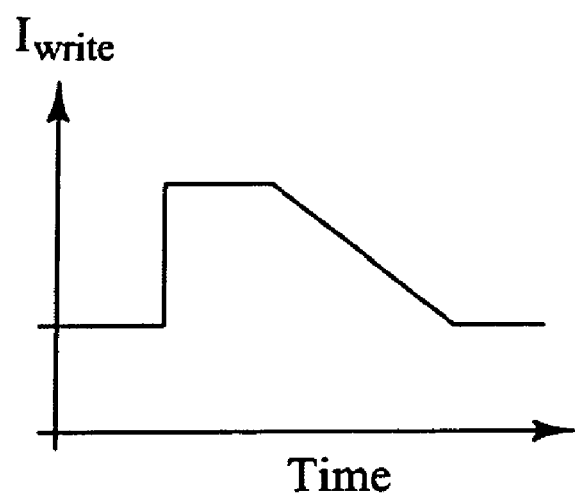
FIG. 4B illustrates an embodiment of a set write pulse for writing a phase change memory cell into the set state.

An ovonic memory cell may be reset by applying a current pulse of amplitude at or greater than Ireset with a fast trailing edge, generally less than five nanoseconds, as shown in FIG. 4A. Alternatively, the trailing edge for set may be slower than reset, such as greater than 50 nanoseconds, allowing use of the same amplitude pulse as reset—as shown in FIG. 4B. Note that the pulses shown in FIGS. 4A and 4B are idealized;

in a practical system, there may be considerable rounding of the edges and ringing in the pulse transitions. Also, the pulse width can be considerably narrower than shown, resulting in a roughly triangular waveform in some embodiments.

Referring to FIG. 4A, a pulse with a fast trailing edge may be used to set or reset a bit. To set a bit, the peak current may be selected to be in the flat region of the write current characteristics shown in FIG. 2, or about one milliamp, and to reset a bit, a higher current above the flat region may be selected, such as 2 milliamps.

Alternatively, to reduce sensitivity while setting a bit, the same current amplitude adequate for resetting the bit may be used in combination with a slow trailing edge, as shown in FIG. 4B. Since the required current for set is often considerably less than the reset current, this technique allows multiple bits to be set in parallel while retaining considerable tolerance to parasitic voltage drops arising from ground path currents and to bit-bit variations in the current amplitude required to set a bit—since the current to write the set bit can be less than for reset. Although the bits receive varying current, preferably between 80 and 100% of Ireset, the use of the slow trailing edge produces relatively optimum (low) set bit resistance for reading.

Referring again to FIG. 1, write currents applied to multiple memory elements 12 are conducted to system ground 20. In some cases, these ground currents share common conductors, causing parasitic voltage drops that may reduce the set current applied to each individual memory element 12 when multiple bits are programmed in parallel. Using a relatively high pulse amplitude for the set current allows more bits to be set in parallel before the parasitic voltage drops reduce the set signal below that required to write the bit to the set state (e.g. below about 70% of the current, Ireset (min) necessary to write the bit to a reset state).

Figure 5:
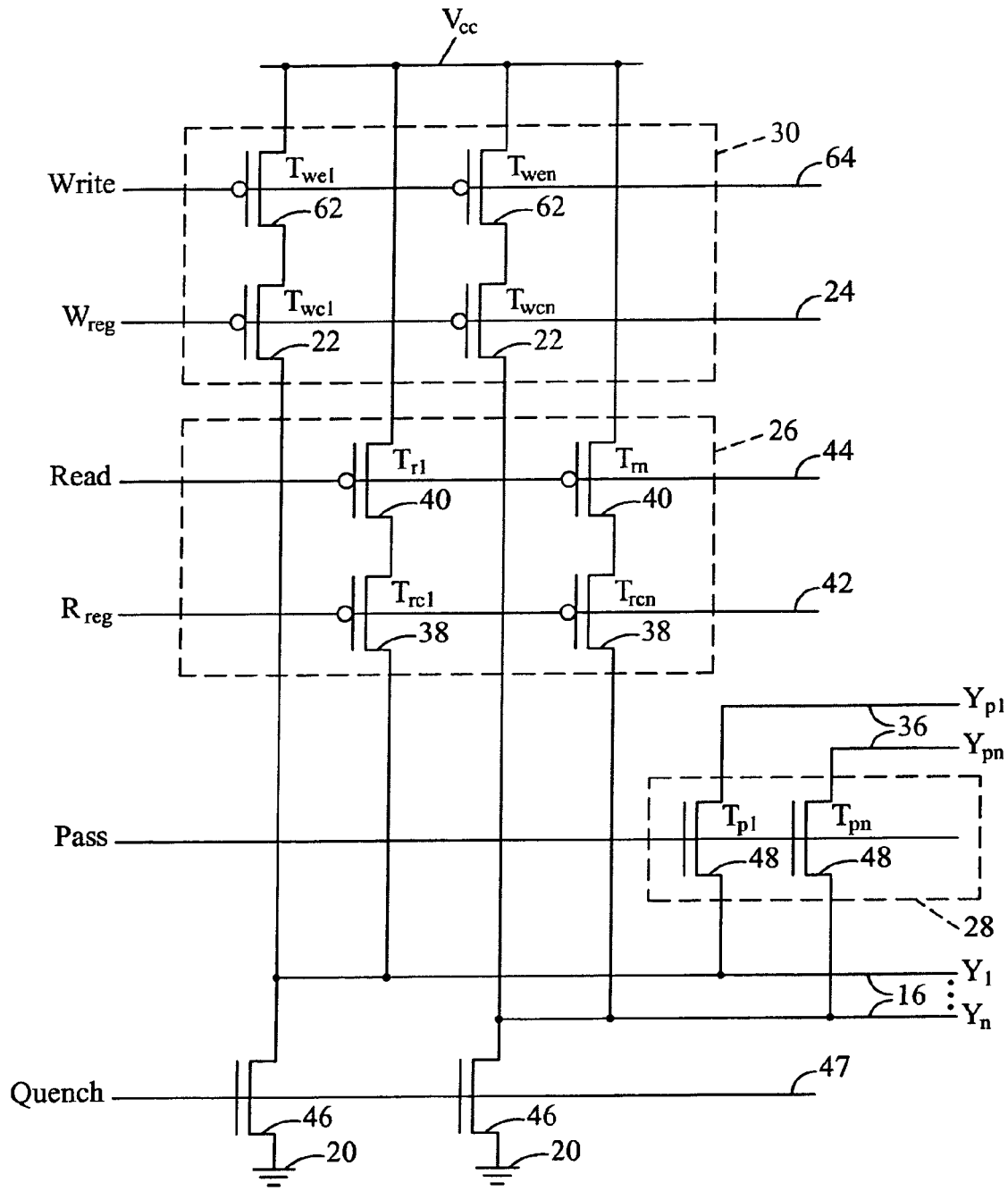
FIG. 5 is a schematic diagram depicting embodiments of write driver, pass switch, read driver, and quench switch circuits.

The current for read or write may be applied by a current source or a voltage in series with a load resistance. FIG. 5 shows an embodiment of a write current source 22, implemented as a p-channel transistor with a gate controlled by write current reference signal 24 (Wreg), a regulated voltage provided by a current mirror circuit. Alternatively, the regulated voltage may be provided by another type of regulation circuit, such as band gap generator, designed to hold the current at the correct level and temperature coefficient over power supply and operating temperature ranges.

In some embodiments, the set and reset write current amplitudes may be adjusted during testing at final assembly. For example, a memory chip may be attached to a test station that applies varying write currents to each bit in array 10 and the nominal write current is adjusted to be at or above the highest current required by any bit in the array 10, plus a margin to assure that the rest reset bit is saturated in resistance and well above the minimal level. The margins are selected to ensure that the reset bit remains reset even as the integrated circuit, and its required set and reset currents, change over time due to temperature or other effects.

Figure 6:
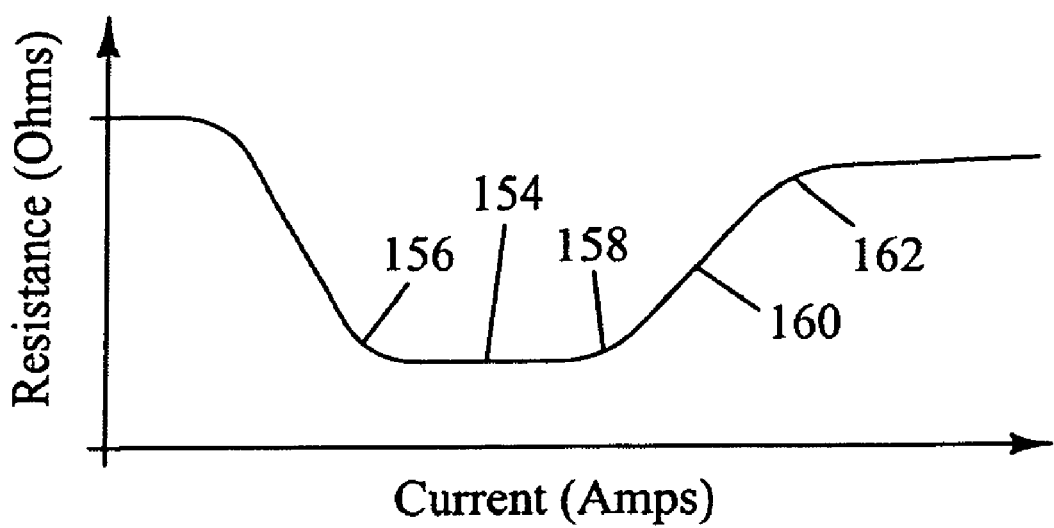
FIG. 6 illustrates the resistance-current characteristics of an idealized phase-change memory cell.

Thus, a memory array designer may select the set current pulse width, amplitude, and shape to achieve the appropriate writing characteristics. FIG. 6 shows an idealized IV response for a phase change memory cell. In one embodiment, a nominal set pulse amplitude 154 may be used along with a fast trailing edge as shown in FIG. 4A. Using this design point, careful control must be maintained over the peak current to ensure a reasonably low set resistance. That is, the current may range between minimum set pulse amplitude 156 and maximum set pulse amplitude 158 in FIG. 6.

Similarly, a reset pulse amplitude greater than low reset pulse amplitude 160, or more preferably nominal reset current amplitude 162, may be selected. Note that the low reset pulse amplitude 160 will not produce high saturated resistance, although the reset resistance may still be adequately high to differentiate the reset state from the normal set state achieved by nominal set current 154. In comparison, if the higher nominal reset pulse amplitude 162 is chosen, the dynamic range, the ratio of reset resistances to set resistance, may be greater than 10:1. If the low reset pulse amplitude 160 is selected, a dynamic range as low as 2:1 may result. A properly designed sense amplifier may distinguish this difference using techniques familiar to those reasonably skilled in the art.

Alternatively, a write pulse amplitude greater than nominal reset pulse amplitude 162 may be chosen for both a set and reset cycles. The fall time is the time required for the write pulse to decrease from approximately 90% of the designed peak amplitude to within 10% of the designed peak amplitude. In this embodiment, the fall time should be relatively fast, less than 1 nanoseconds to reset a bit, and relatively slow to set a bit, such as greater than 10 times the reset fall time. In some applications, the set fall time may be greater than 100 nanoseconds to better assure a low set resistance. In general, the fall time will depend on the alloy selected for the phase-change material. The resulting resistance ratio is greater than 2:1 using the same amplitude for both set and reset pulses. The bit state difference results from the difference in the trailing edge times when using an amplitude adequate to write the bit to either a set or reset state.

When relatively low write pulse amplitudes are used, illustrated by selecting nominal set current 154 and a low reset current 160, relatively smaller write drivers may be used. Furthermore, use of lower reset and set pulse amplitudes improves endurance, often as much as several orders of magnitude. The required write current for a specific bit may drift over time, primarily due to the number of write cycles applied to the bit. If the bit changes over time so that less current is required to achieve the same resistance as before the change, then leaving the pulse amplitude fixed results in more overdrive; that is, the relative reset pulse amplitude will vary from low reset current 160 towards a high reset current 162 as the chip ages. Hence, that bit will write to a higher resistance and its endurance will decrease. By employing lower pulse amplitudes and increasing the endurance, the ideal reset amplitude may drift less over time and in some instances may increase the maximum number of cycles from 1E7 to greater than 1E9.

In most applications, only a portion of memory cell population will experience the maximum number of cycles allowed by the specification; thus, few bits will experience reduced endurance. Lowering the write pulse amplitude will usually improve endurance, though improved endurance is not assured unless adequate margin to write is provided, margin adequate to assure achieving adequate set and reset resistance. In any case, programming may be done at lower pulse amplitudes and using smaller drivers. Smaller drivers improve array efficiency, the ratio of the size of the memory array 12 relative to the size of the overall integrated circuit chip. Lower write pulse amplitudes improve power consumption, which leads to better battery life in portable systems.

To reduce voltage drops due to inductance, the number of bits written in parallel may be increased and decreased during a parallel write back cycle. For example, a sequential series may be used where four bits are initially written in parallel, followed by 8, 16, and then 32, followed by 16, 8, and then 4 to close the cycle. The resulting slow build up and reduction in write current may reduce peak dI/dt, reducing inductively induced parasitic voltage drops.

Additional embodiments may change the write current and the trailing edge fall time to create more than two states in a single memory element 12 where the different states are differentiated through having different resistance ranges produced by amplitude or trailing edge rate.

Figure 7:
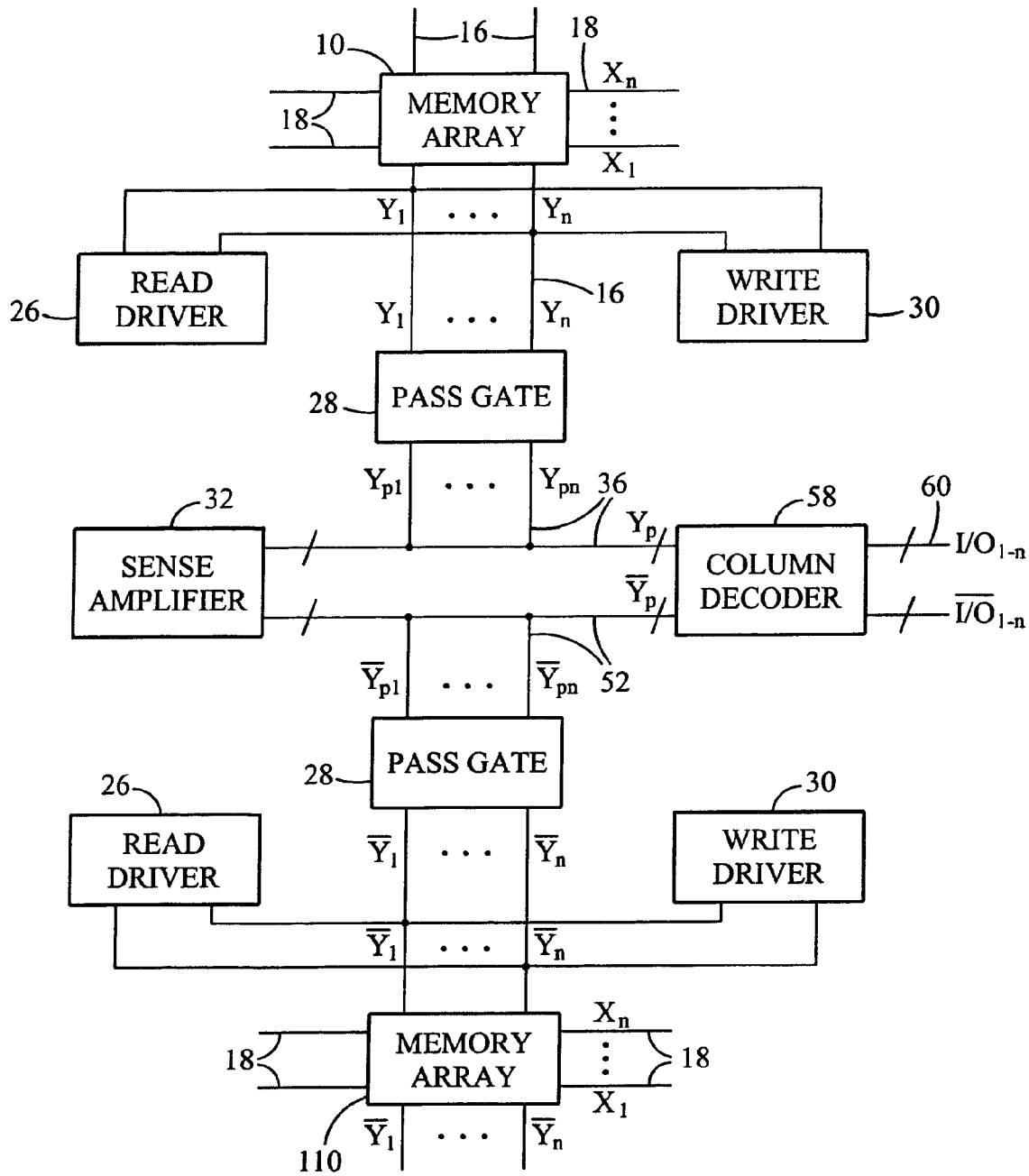
FIG. 7 is a block diagram showing an illustrative relationship between the memory array of FIG. 1, the circuits of FIG. 5, and the sense amplifier of FIG. 8.

FIG. 7 is a block diagram of an embodiment of a memory array 10 connected to read, write, and address decoder circuits. In FIG. 7, column lines 16, designated Y1 through Yn, interconnect memory array 10 and its column lines to a read driver circuit 26 and write driver circuit 30. Column line 16 may also be connected through an optional pass gate circuit 28 to a sense amplifier 32. Pass gate circuit 28 may be used to isolate memory array 10 from sense amplifier circuit 32 for more sensitive amplification of small signals by sense amplifier 32. When used, pass gate circuit 28 interconnects column lines 16 to pass column lines 36, designated YP1 through YPn. When pass gate circuit 28 is not used, column lines 16 are connected directly to the corresponding pass column lines 36.

Column decoder 58 selectively connects sense amplifier circuit 32 and column lines 36 to I/O lines 60, usually implemented as true and complement. In some embodiments, both true and complement pass column lines 36 and 52 are provided to sense amplifier circuit 32 and column decoder 58.

Referring again to FIG. 5, write driver circuit 30, pass gate circuit 28, and read driver circuit 26 are shown. Read driver 26 is connected to each column line 16, the read driver circuit 26 including a current regulator 38, designated Trc, and a read switch 40 (to enable read current), designated Tr. In the embodiment shown; current regulator 38 is implemented as a p-channel FET, and the regulated current is set by the read current regulation signal 42, designated Rreg, connected to the gate. In some embodiments, the voltage of Rreg may be set by a p-channel current mirror controlled by a band gap regulator. If a voltage higher than Vcc is required for read or write, the voltage may be created with a charge pump and regulated using a band gap regulator to track temperature and minimize variation with changes in power supply voltage. Current regulator 38 may be turned on by applying a preselected voltage, such as 0V, to read enable line 44, turning on read switch 40. Current mirror and band-gap regulator circuits are well known to those reasonably skilled in the art of integrated circuit design.

Figure 8:
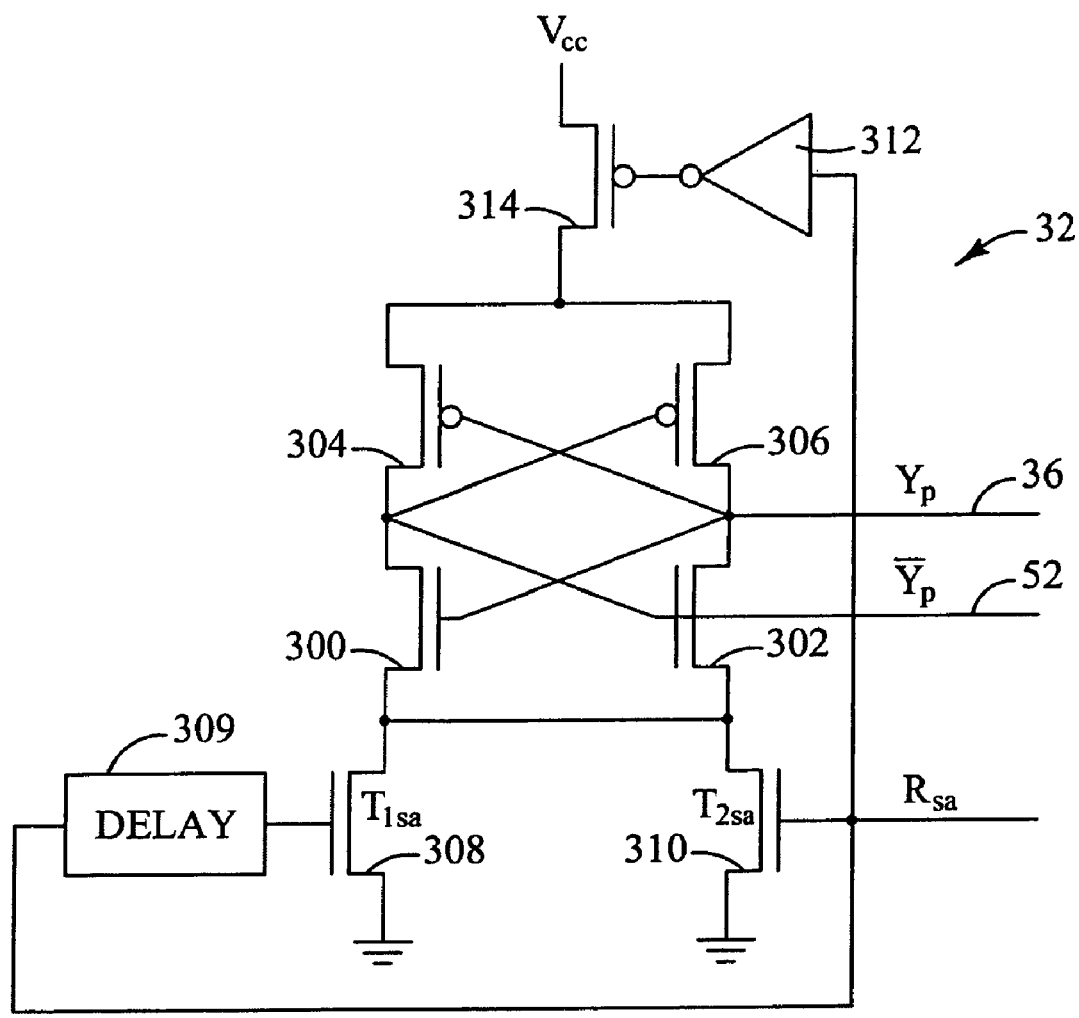
FIG. 8 is a schematic diagram of an embodiment of a sense amplifier.

To read a particular memory element 12, read enable line 44 may be asserted to turn on read switch 40, which applies current regulated by each Trc to each corresponding memory element 12. In FIG. 1, when select switch 14 turns on, corresponding memory element 12 drives column line 16 down through the select selected memory 12. The voltage on a pre-charged column line 16 falls at a rate that depends on the resistance of memory element 12: if the resistance is high, the voltage falls slowly; if the resistance is low, the voltage falls more quickly. The voltage rate of change may be sensed or compared to a reference level. Alternatively, current may be forced into column line 16 by Trc (FIG. 5,) and the voltage of column line 16 may be compared to a fixed reference after a fixed time. An exemplary comparison circuit is sense amplifier 32 as shown in FIG. 8.

Other embodiments for reading the cell state may be used. In one embodiment, the column line voltage may be maintained at a particular bias voltage, 0.4 volts for example, and the resulting current sensed. The resulting current will vary with the resistance of memory element 12.

In yet another embodiment, column lines 16 may be pre-biased near ground and driven high by an applied read current. A memory element 12 in a low resistance state will tend to maintain a low column voltage; a high resistance memory element 12 will maintain a correspondingly higher column voltage. Using an ovonic memory for illustration, a set bit is in a low resistance state and may have less than 10 k ohms resistance. The final voltage on a column line 16 will be less than 0.1 volts for a 10 uA read current. A reset bit is in a high resistance state, greater than 50 k ohms, and the column line 16 will rise to 0.5 volts for a 10 uA read current. In some embodiments, it may be preferable to clamp column line 16 so that the voltage does not exceed pre-selected limit voltage to avoid exceeding the threshold voltage, Vth, when the bit is in a higher resistance reset state. For example, if a particular cell technology has a Vth of 1V, the clamp voltage may be set to approximately 0.6V. Alternatively, a sensor may be used to terminate the read cycle should the column line attempt to exceed the limit voltage and the bit is considered reset. As the bit approaches or exceeds the limit voltage, the bit may be declared to be in the high resistance state and the read cycle terminated. Such limit may be set to 0.5V, implying that reset resistance must be greater than 50 k when 10 ua read current driven into the memory cell.

Referring again to FIG. 5, a quench switch 46 may be connected between each column line 16 and system ground 20. When array 10 is quiescent, quench signal 47 is asserted so that quench switch 46 is turned on. When a read or write cycle is initiated, quench signal 47 is de-asserted to turn off quench switch 46. The cycle may be then terminated by reasserting quench signal 47 to turn off quench switch 46. In the embodiment shown in FIG. 5, quench switch 46 is implemented as an n-channel FET. However, other types of devices may be used, either as replacements for or in combination with the n-channel transistors shown. Without limitation, device types further include p-channel FETs or bipolar transistors, n or p-channel FET or bipolar diodes, along with corresponding changes in bias and signal and power supply polarities.

During a read cycle, a pass switch 48 may be enabled to connect one or more column lines 16 to corresponding pass column lines 36, which may be further connected by decoder selection onto I/O column line 60. Each pass column line 36 in turn may be connected to a sense amplifier 32. In the embodiment shown, each pass switch 48 is an n-channel FET, may be sized to furnish an adequate current to the corresponding memory cell 12 during a write reset cycle, or write may be handled instead by write transistors Twe (or by both). Alternately, the pass switch 48 may be deleted, which will usually require slower amplification in the sense amp. As a further alternative, the source and drain of each pass switch 48 may be connected in series with the read current regulator 38 and placed between read current regulator 38 and column lines 16, thereby limiting the voltage applied to memory cells 12 to less than Vth in order to avoid resetting a memory cell 12 during read. As an illustrative example using FETs, the voltage applied to the memory cells 12 will be Vgate−Vt, where Vgate is the gate voltage applied to the pass switch 48, and Vt is voltage from the gate to source (with the drain more positive than the source) at the onset of conduction, roughly 0.5 V. The gate of pass switch 48 may be set to about 1V so that the source of pass switch 48 does not exceed 0.5V.

FIG. 8 illustrates an embodiment using a DRAM style sense amplifier to amplify the read signal from the array 10. Those reasonably skilled in the art will also be able to implement the same function using more of an SRAM style ripple-through sense amplifier. A sense amplifier 32 is generally used to amplify the memory element 12 signal to rapidly and accurately determine the state of a particular memory cell 12 during a read cycle. In the embodiment shown, a complement column pass line 52 is provided as a reference signal to determine the state of memory element 12 connected to pass column line 36. During operation, transistors 300, 302, 304, and 306 compare the voltage applied to pass column line 36 with a reference voltage applied to reference (column pass) signal 52, amplify that difference, and apply the resulting voltage back to pass column line 36. If the sense voltage on line 36 is greater than the reference voltage, the voltage on line 36 will be driven upward to near the power supply limit. Similarly, if the sense voltage is below the reference voltage, then the final state of pass column line 36 will be near ground.

To prevent overdriving the voltage on column line 16 during a read cycle, pass switch 48 (FIG. 5) may be turned on for only a brief period of time at the beginning of the read cycle and before the sense amp is turned on so that read signal is delivered to the sense amp, and then isolated. In an embodiment, the gate voltage applied to pass switch 48 may be held to voltage offset from Vcc, so that pass switch 48 is automatically cut off as the source voltage rises to near the gate voltage during the read cycle. After pass switch 48 is turned off, quench switch 46 may be turned on to drive column line 16 to ground to avoid exceeding memory cell voltage limits when sense amplifier 32 amplifies the pass column signals 36 and 52 during a read cycle. While pass switch 48 is turned off, a low current strobe transistor 308, designated T1s, may be used to turn on to pre-amplify the signal and then, after a delay provided by delay element 309, a high current strobe transistor 310, designated T2s, may be turned on to more rapidly complete amplification. In some embodiments, it is preferable that T1s be much smaller than T2s to limit the rate of change of the signal on pass column line 36 until adequate signal develops. Inverter 312 and transistor 314 may be optionally used to further amplify the signal or disable sense amplifier 32 upon completion of the read cycle. Rsa enables the start of the read amplification process and may also enable terminating the drive into the sense amplifier 32. In some embodiments, bias transistors (not shown) from pass column line 36 and its complement 52 may be provided to drive and pre-charge the nodes during the inactive cycle. Also, this bias transistor may be used to equilibrate and maintain the nodes during the inactive cycle.

Column decoder 58 may connect the selected column lines 16 or, if pass switch 48 is used, pass column lines 36 to output I/O lines 60 after the signal voltage applied to the selected column lines during a read cycle has risen or fallen an adequate amount to assure that the state will be preserved when the sense amplifier 32 is loaded with the capacitance on the I/O lines 60 selected by column decoder 58. I/O lines 60 are connected to the output stage of the memory chip (not shown) for driving the data off of the chip to external circuits.

Referring again to FIG. 5, write driver 30 includes a write current source 22 and a write switch 62 connected to each pass column line 16. In another embodiment, write driver 30 may be replicated and connected in parallel to provide a current that writes a set state from one driver and writes a reset state for the other driver 30, where the amplitude or trailing edge set of write drivers is adjusted optimally for writing the reset state, and the other set may be adjusted optimally for writing the set state.

Alternately, writing data may be accomplished by driving data from the I/O circuits onto the I/O lines 60, traversing the chip through column decoder 58 and overpowering sense amplifier 32 to a preferred new state, which in turn may write memory array 10, with or without the assistance of write driver 30. To reduce the current required to change the sense amplifier 32 state using this I/O write technique, sense amplifier 32 may be turned off by turning off strobe transistors 308 and 310.

To apply current to the memory elements 12 all pass switches 48 may be turned on so that pass column lines 36, Yp1 through Ypn, are driven in parallel. Each write switch 62 corresponding to a selected array column memory element 12 may be turned on by write enable signal 64 to create a current pulse as shown in FIG. 4A. Write current is regulated by write current source 22. Write signal 64 may be generated by decoder 58 in response to data on I/O lines 60. The write cycle may be terminated by either a fast or slow trailing edge to reset or set memory element 12, respectively, as shown in FIGS. 4A and 4B. The slope of the trailing edge may be controlled by the write enable signal 64 or write current reference (Wreg) 24. Alternatively, the current amplitude may be adjusted to set or reset memory element 12 using a relatively symmetric current pulse as shown in FIG. 4A, but with lower amplitude than for a set pulse. In either case, the current amplitude may be controlled by the voltage applied to write current reference (Wreg) 24.

One or more write switches 62, Twe, may be selectively disabled by decoding the control input of the write switches 62 (i.e. the transistor gate), or by use of a mask register. Then, only the column lines 16 and sense amplifier 32 selected by decoder 58 controlling the selected write switch(es) 62 will be written. Pass switches 48 may be turned on during write to allow the sense amplifier 32 or column I/O lines 60 to apply write current to the corresponding selected column line 16 to the selected memory elements 12. Thus, a parallel set of sense amplifiers 32 may be loaded with column lines 16 corresponding to selected memory elements 12.

Alternatively, the corresponding sense amplifier 32 may be turned off during the write cycle and the write current directed to the selected Y column line 16 from the write current source 22, Twc, or from decoded I/O lines 60.

Page mode access allows reading in parallel from array 10 if the corresponding pass switches 48 are turned on. Pass switches 48 may be turned on for a whole set of columns, such as all selected by the selected row, or for fewer columns such as those selected by the decoder 58. In some embodiments, the word width may be fixed or adjustable electronically by bonding option or selected dynamically using a register to drive pass switches 48 (which may be pre-loaded before the write cycle). The number of column lines 16 selected during a write cycle may include one bit, a nibble (4 bits), a byte (8 bits), a multi-byte word, or multiple words at once.

Referring again to FIG. 1, the use of transistors for select switches 14 allows selection to be done with a low current flowing through row line 18 because the gate of the select transistors presents high impedance. In the embodiment shown, row line 18 is connected to the high impedance gate of the select switch 14. Also in the embodiment shown, the source of each switch 14 is connected to system ground 20. Alternatively, a select diode or OTS may be used as a select switch, but the driver transistor (not shown) for each row line 18 must be correspondingly larger to sink the higher load currents. To reduce the size of the driver transistor, parallel writes may be done in sets of two or more bits until all bits are written as required for that write cycle.

In the physical realization of these techniques for parallel access, the ground connections may be designed to minimize variable parasitic voltage drops to each memory element 12 which may cause errors in determining the state of the bit when reading or writing the state of the bit. These drops are due to the impedance of the ground conductors and are generally proportional to the sum of the currents carried by the ground conductors, which varies positionally with the placement of the bit in the array and the ground distribution pattern. Accessing a single memory element 12 at a time generally results in smaller parasitic voltage drops. During a parallel access of more than one bit, the sum of the currents from multiple memory elements generates larger parasitic voltage drops.

Figure 9:
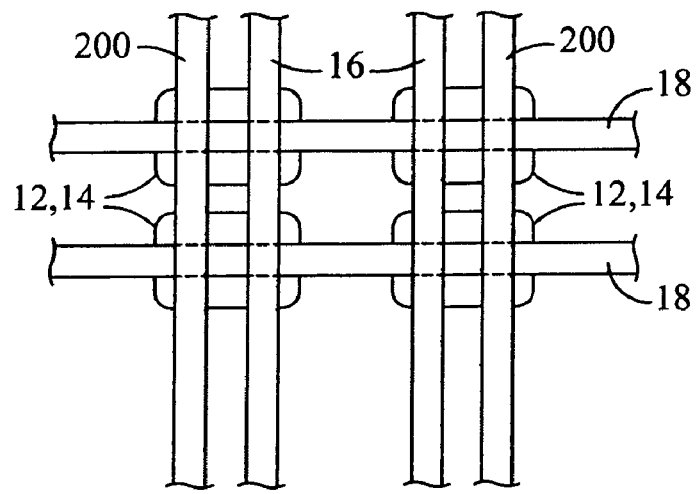
FIG. 9 is a plan view of an embodiment of a memory array having ground lines parallel to column lines.

In the exemplary memory array 10 shown in FIG. 9, the row and column lines are physically oriented as orthogonal rows and columns. A connection to ground 20 from each select switch 14 may be made by a ground line 200 placed parallel to the corresponding column line 16, either above, below, or beside column line 16. For clarity, the vertical connections between memory element 12 and select switch 14 are not shown. In these embodiments, the total current carried by each ground line 200 does not increase as more column bits are selected because the currents flow into parallel grounds. Ground lines 200 may be interconnected and must contact system ground 20, preferably by minimizing the lines carrying more than one parallel current. The ground lines running parallel to the column lines 16 may be further interconnected within array 10, resulting in a grid. However, interconnecting the grounds may result in variations in voltage drops with different bit patterns and placement on the columns, albeit with the same or less voltage drop than without interconnections.

Figure 10:
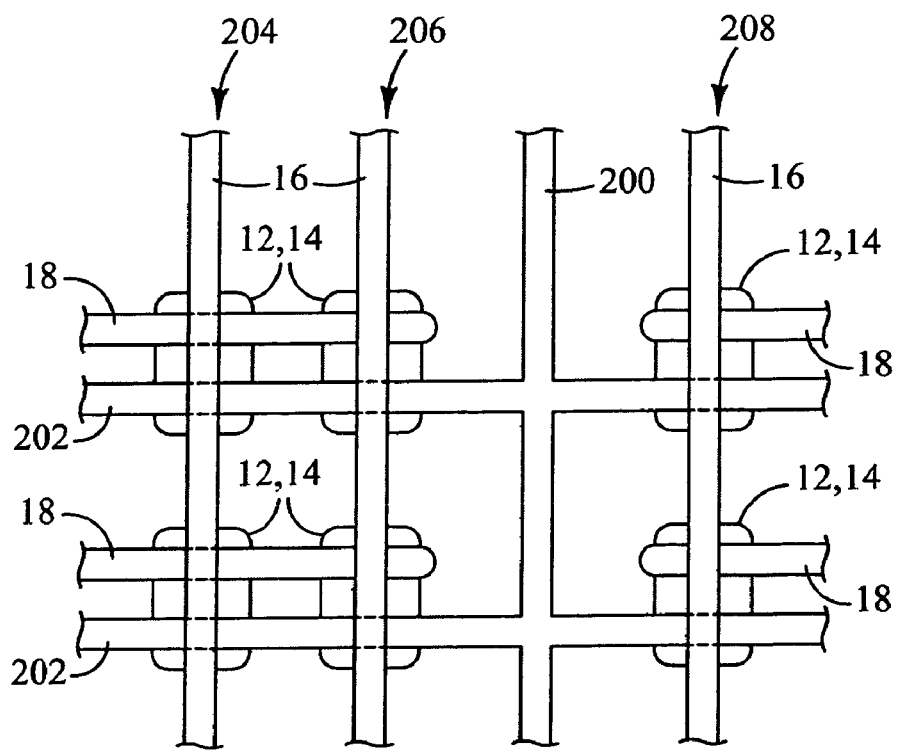
FIG. 10 is a plan view of another embodiment of a memory array having one or more ground lines parallel to row lines.

Alternatively, it may be desirable for the ground connection from select switch 14 to run approximately orthogonal to column line 16, again with the ground lines connected to ground 20. In the embodiment shown in FIG. 10, every few column lines 16 may be spaced apart to allow placing a ground line 200 parallel to the column lines 16 and interconnecting to ground lines 202 running orthogonal to column lines 16. This spacing difference is illustrated by showing the relative spacing between columns 204 and 206 as smaller than spacing between columns 206 and 208. The parallel connection of ground lines provides a grid to allow a reasonable distribution of parallel column currents into the orthogonal ground lines without significantly increasing the ground drop along the ground line connections. Absent an effective ground connection, the cumulative current and voltage drops would potentially accumulate to levels that excessively degrade read and write margins, and cause considerable variation bit to bit.

Row lines 18 may be implemented as polysilicide for low resistance and resistive-capacitive delay, allowing a ground line connection to the source of the switch 14 to track parallel to row lines 18 and orthogonal to the column lines 16. By spacing apart column lines 16 periodically, a ground line 200 may be run parallel to the columns to interconnect the orthogonal grounds 202. The ground line parallel or orthogonal to the columns may be implemented in metal, including aluminum, copper, or tungsten for further reduction in delay and drop.

Figure 11:
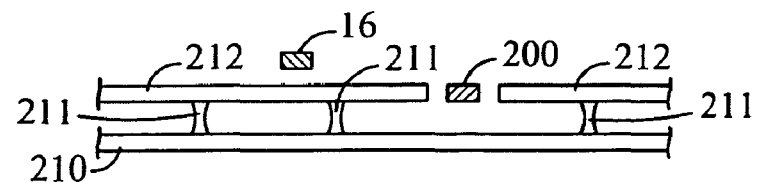
FIG. 11 is a side section view of an embodiment of a memory array having one or more ground lines parallel to row lines and an embodiment of a two-layer row line.
Figure 12:
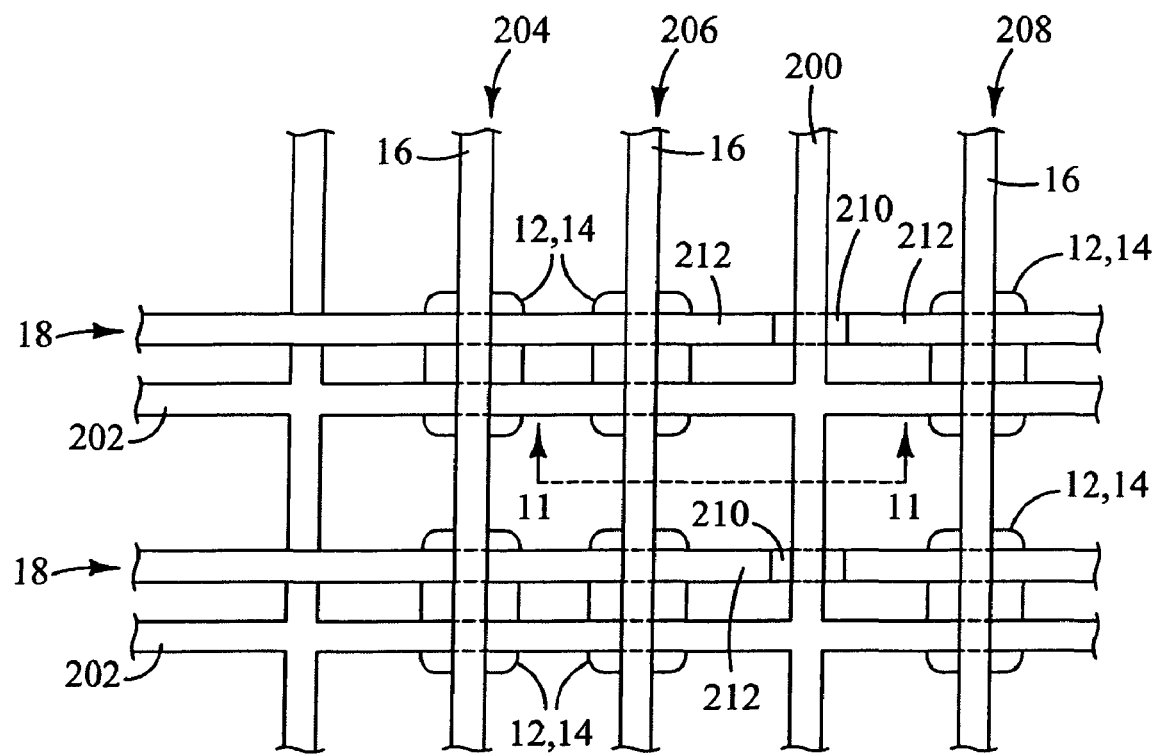
FIG. 12 is a plan view of the memory array shown in FIG. 11.

In a similar embodiment shown in FIG. 11, row line 18 may be implemented as a polysilicide layer 210 shorted periodically by connections 211 to a metal layer 212 running along the top of polysilicide layer 210. Metal layer 212 may be broken periodically to allow parallel ground line 200 to cross row line 18, with continuity of row line 18 maintained by the polysilicide bridge over or under the gap in metal layer 212. The additional metal layer 212 reduces resistance and consequential resistive-capacitive delays. Similarly, polysilicide layer 210 may be broken or jumped by other lines necessary for interconnect, which is especially useful in applications having circuits for additional functions embedded within the array 10. A top view of an array 10 employing the dual layer row line 18 of FIG. 11 is shown in FIG. 12. Note that FIGS. 9-12 are not to scale.

In a related embodiment, a ground line orthogonal to row lines 18 may be implemented on a separate level of metal and connected to the separate metal ground levels through a via.

Figure 13:
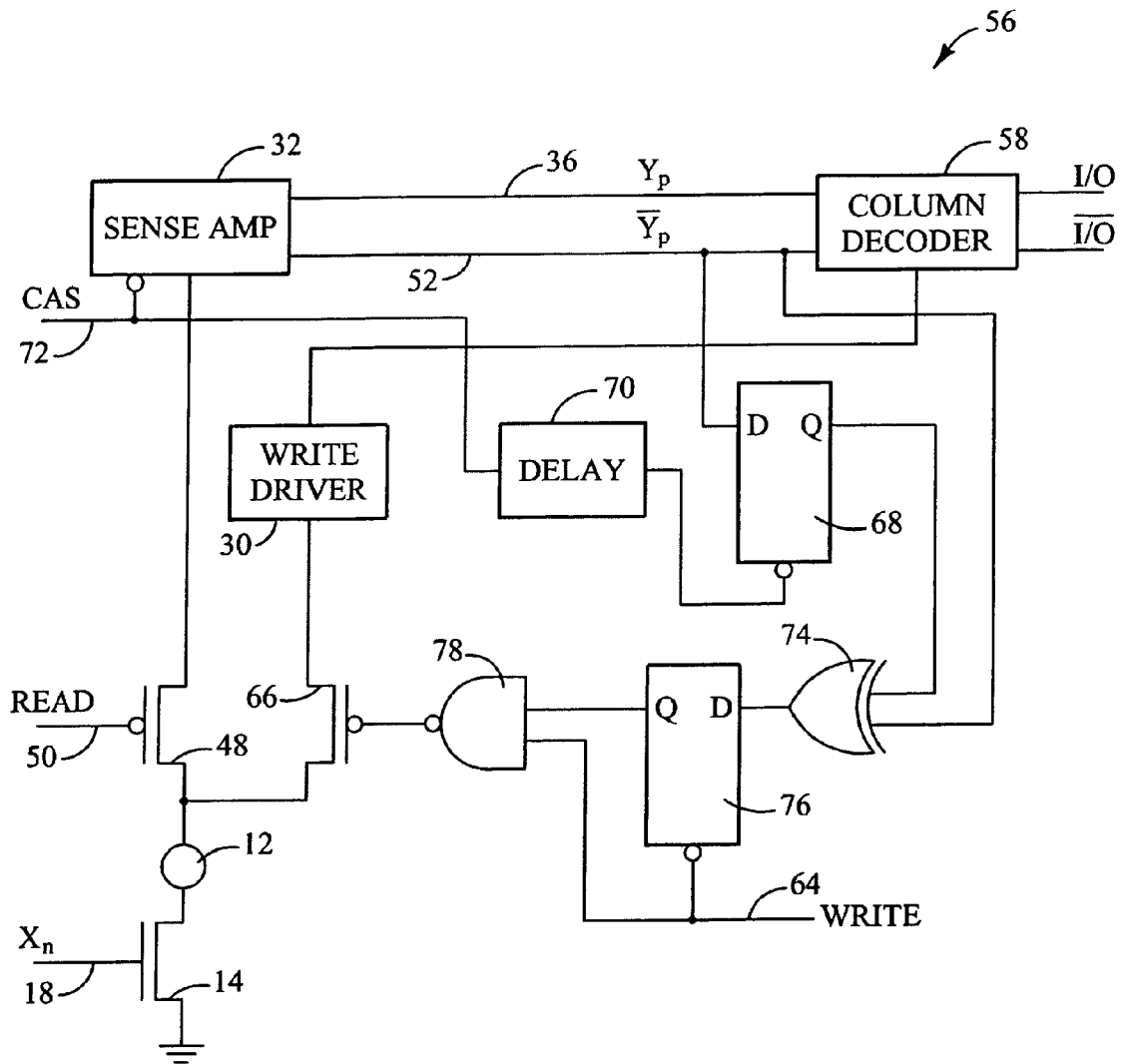
FIG. 13 is a schematic diagram of an embodiment of a circuit for reducing the number of write accesses applied to memory cells within a memory array.

When performing a write operation immediately after a read operation, such as during read-modify-write operations commonly performed while executing error-correction codes (ECC), write suppression circuitry may provide improved endurance by reducing the number of writes to each individual bit. This reduction in writes is achieved by suppressing the write signals to a memory cell if it is already in the correct state. In an embodiment of a write suppression circuit 56 shown in FIG. 13, pass switch 48 is connected to pass signal 50. A write pass switch 66 is added in series to the write driver 30. The series combination may drive the array column line during write if the data into the selected bit is to be changed. During the read cycle, latch 68 is loaded with read data from sense amplifier 32 after an appropriate delay, controlled by delay line 70. Data is clocked into latch 68 after a delay provided by delay line 70 from the beginning of the read cycle, denoted by the falling edge of column address signal 72 (CAS). During the subsequent write cycle, when write enable signal 64 goes low with CAS still low, data is applied to the pass column lines 36 and the previously stored data from latch 68 is compared to the new write data by exclusive-or gate 74. Comparison data is loaded into write latch 76 and presented to AND gate 78, which enables write pass switch 66 only on the condition that the write data is different than the data previously read from the memory element 12. Using this technique, memory element 12 is only written when the write data is actually different from the read data already loaded in memory element 12, thus reducing the number of write cycles applied to memory element 12.

In an alternative embodiment, an additional read sense amplifier (not shown) may be provided which is loaded in parallel to the sense amplifier 32 as shown in FIGS. 7 and 8. The bit from the read sense amplifier is compared to the write data in the sense amplifier 32 on a subsequent write cycle. If the data are different, the gate of pass transistor 48 may be selectively enabled so that the bit is only rewritten if the data is different. Persons skilled in the art will recognize that the functions of the circuit embodiment shown in FIG. 13 may be implemented in other ways using standard logic and circuit design techniques, for example, by changing the polarity of the signals.

In some embodiments, the memory elements 12 in each column must be periodically refreshed, meaning that the data must be read and rewritten to restore the full read margin to each memory element 12. For example, a refresh algorithm may be executed on each power up or power down. In this case, all memory elements must be read regardless of the data read in the previous read cycle. Referring again to FIG. 5, write pass switch 66 must be enabled during a refresh cycle regardless of the output of exclusive-or gate 74, using additional circuitry that will be apparent to those reasonably skilled in the art.

The row selected "on" during a read or write access enables the word line selection of more than one column. For example, in a 1,000,000-bit memory array logically organized as a square, 1,000 word lines access bits to 1,000 column lines. If all the bits are read in parallel, a page of 1,000 bits may be available for column access. All the column bits may be accessed so the bits selected by the row line are read and loaded into sense amplifiers or a register in parallel. Such reading may be literally in parallel or sequentially to reduce peak current drain. Once all the bits are loaded in parallel into sense amplifiers or registers, the information is available for use by the user through column access by column addressing.

In theory, 1,000 pins could be brought off chip to the external bus, providing access to 1,000 bits in parallel for reading or writing. However, to reduce pin count, the bits are addressed using column addresses and may be available to the user in combinations of 1 or more bits at a time. If any data has been written to the page, those one or more bits may be written either sequentially or in parallel back to the selected array row bits.

For volatile DRAM, the row line can only be maintained low until a refresh is required, such as every 16 milliseconds. For embodiments herein, a non-volatile memory cell 12 is used so that row line 18 may be maintained low for a much longer period of time—nearly indefinitely at room temperature, and as long as ten or more years at 55 C, depending on the alloy chosen for the phase change memory. Accordingly, a page of memory may be available nearly indefinitely to the user through the embodiments herein by maintaining the row address cycle (e.g. by asserting and retaining row address strobe RAS low) until a different page is required. Then at the close of the cycle, any data ready to be written from the page (cache) may be written sequentially or parallel to the array, prior to de-asserting RAS. The cycle is then terminated by de-asserting RAS, and a new page may be fetched by changing the address and asserting RAS. The fetched page may have several bits or words per block, or even the entire set of columns on the selected row, or the portion of the address selecting the row in a parallel address approach.

Memory chips may be organized into blocks, each block having one or more memory arrays 10 and associated access circuitry. In some embodiments, more than one block may be selected simultaneously, increasing the number of bits or words accessed in parallel. In some embodiments, a system having multiple chips may be implemented, so that multiple chips can be simultaneously selected. Thus, bits, blocks, and chips may be selected simultaneously and accessed in parallel. Each additional level successively increases the amount of memory made available at each address.

Thus, the embodiments herein allow a page to be selected for long periods of time, from seconds to hours to years, instead of closing a page by asserting RAS more than once per second as dictated by refresh requirements. In some embodiments, an entire page, for example 1,024 bits, may be selected while RAS is asserted, and the bits may be accessed in words of 16, 32, 64, 256 or more bits in parallel. By such means, a high-speed cache may be accessed indefinitely without the requirements for periodically closing the page for refresh that is normally associated with DRAM. Thus, average memory performance is faster and may approach or exceed that provided by SRAM cache. Further, unpredictable latency in the form of increased read access time is avoided by embodiment herein, whereby the cache is not rendered temporarily unavailable due to a need to refresh.

Referring again to FIG. 7, another memory array 110 may share sense amplifier 32 and write driver 30 along with memory array 10. Memory array 110 has a corresponding read driver circuit 26 and a pass gate circuit 28. In some embodiments, memory array 110 may be written with complimentary data to improve signal to noise ratio and improve signal margins. In other words, the complement of each bit written in memory array 10 is stored in memory array 110 so that when data is read, the two bits form a complementary pair. In this embodiment, memory array 110 is connected to complement pass column lines 52. Sense amplifier 32 compares the complementary signals appearing on pass column lines 36 and complement pass column lines 52.

Alternatively, memory array 110 could be addressed complementarily so that when memory array 10 is not selected, memory array 110 is selected. In this case, a separate reference must be provided to compare each bit when reading.

FIG. 7 shows that sense amplifier 32 and write driver 30 may physically fit in the center of a pair of memory arrays 10 and 110. In this physical layout, the column lines 16 and corresponding pass column lines 32 pass from memory array 10 traversing write driver 30 and sense amplifier 32 and passing all the way to memory array 110.

Figure 14:
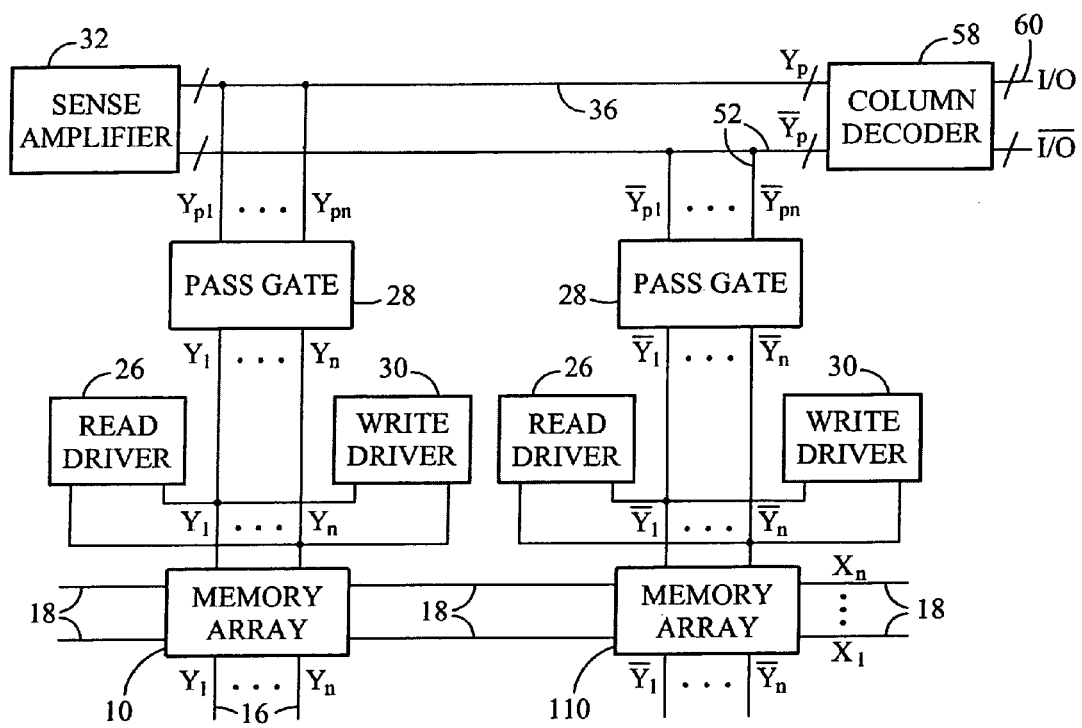
FIG. 14 is a block diagram showing an alternative relationship between the memory array of FIG. 1, the circuits of FIG. 5, and the sense amplifier of FIG. 8.

In FIG. 14, an alternative arrangement is shown wherein the memory array lines depart sense amplifier 32 to the side in a "folded bit" approach so that the amplified column lines may be more readily accessed from the side of the sense amplifiers, especially if the sense amplifiers 32 are located on the side of memory array 10. This arrangement may be useful in memory circuits supporting video mode accesses, where a register may be connected to the sense amplifiers 32.

Figure 15:
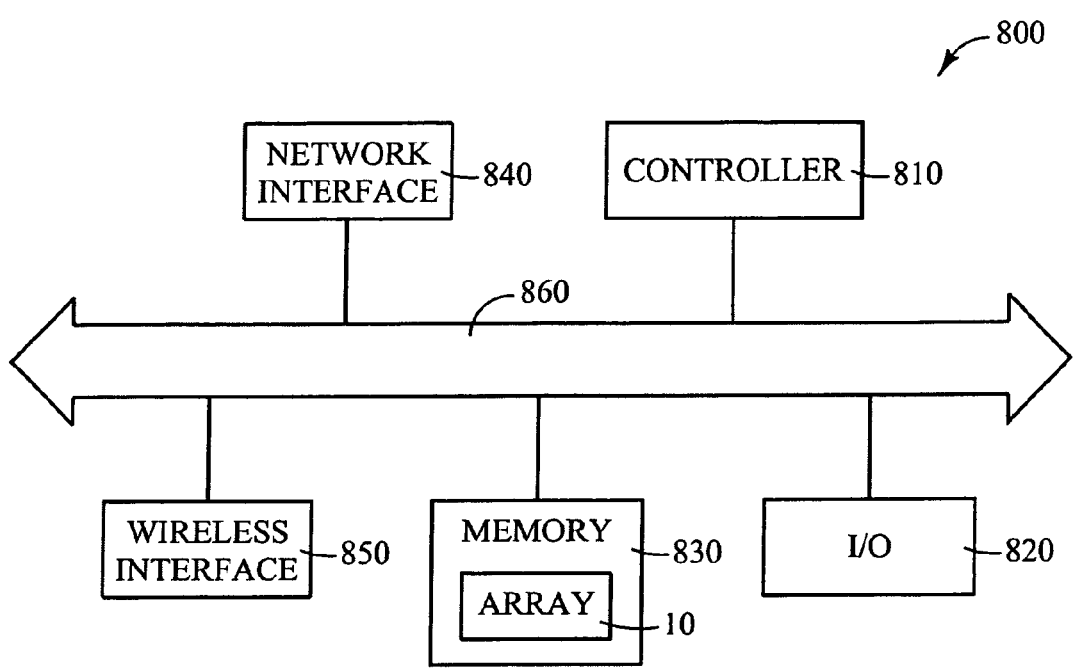
FIG. 15 is a block diagram of an embodiment of a computer system employing a memory array according to embodiments of the invention.

FIG. 15 depicts an embodiment of a system 800. System 800 may be used in computing devices such as, for example, a personal computer, a workstation, or portable devices such as, for example, a personal digital assistant (PDA), a laptop or portable computer, a web tablet, a wireless telephone, a pager, an instant messaging device, a digital music player, a digital camera, or other computing devices. Depending on the configuration, any or all of these computing devices may be adapted to transmit and/or receive information wirelessly. System 800 may be used, without limitation, in any of the following systems: a local area network (LAN), a wireless local area network (WLAN) system, a wireless personal area network (WPAN) system, or a cellular telephone network.

Embodiments of system 800 may include a controller 810, an input/output (I/O) device 820 (e.g. a keypad, display), a memory 830, a network interface 840, or a wireless interface 850 interconnected via a bus 860. System 800 is not limited to embodiments having any or all of these components. Any one of the components may use the memory embodiments described herein.

Controller 810 may comprise, for example, one or more microprocessors, digital signal processors, microcontrollers or the like which may utilize non-volatile phase change memory accessed as described herein. Memory 830 may be used to store messages transmitted to or by system 800. Memory 830 may also optionally be used to store instructions that are executed by controller 810 during the operation of system 800, and may be used to store user data. Memory 830 may be provided by one or more different types of memory. For example, memory 830 may comprise any type of random access memory, a volatile memory, a non-volatile memory such as a flash memory, or a memory such as the memory and access techniques described herein. In some embodiments, memory array 10 may be accessible by connecting I/O lines 60 (FIG. 7) to bus 860.

I/O device 820 may be used by a user to generate a message. System 800 may use wireless interface 850 to transmit and receive messages to and from a wireless communication network with a radio frequency (RF) signal. Embodiments of wireless interface 850 may include, without limitation, an antenna or a wireless transceiver.

Similarly, system 800 may use network interface 840 to transmit and receive messages to and from a wired communication network. Embodiments of wireless interface 850 may include, without limitation, 10base2, 10baseT, 100baseT Ethernet, USB, or Token Ring connections.

System 800 may use, without limitation, one of the following communication protocols to transmit and receive messages: Code Division Multiple Access (CDMA), cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, or the like. Any one or all of these systems or components of the systems may use the embodiments herein.

The exemplary embodiments shown in the figures and described above illustrate, but do not limit, the claimed invention. It should be understood that there is no intention to limit the invention to the specific form disclosed; rather, the invention is to cover all modifications, alternative constructions, and equivalents falling within the spirit and scope of the invention as defined in the claims. For example, while embodiments of the present invention were developed for phase change non-volatile memory, the invention is not limited to use with phase change or non-volatile memory and may be used with other memory technologies. Hence, the foregoing description should not be construed to limit the scope of the invention.

We claim:

1. A method for accessing a plurality of non-volatile memory elements arranged in a two-dimensional array having a plurality of columns and at least one row, comprising:
   selecting a plurality of successively larger complements of memory elements during a first series of successive access operations; and
   selecting a plurality of successively smaller complements of memory elements during a second series of successive access operations.

2. The method of claim 1, wherein the non-volatile memory elements comprise a phase change material.

3. The method of claim 1, wherein the step of selecting a plurality of successively larger complements of memory elements comprises selecting memory elements within a row.

4. The method of claim 1, wherein said selecting a plurality of successively larger complements of memory elements during said first series of successive access operations includes selecting a first number of bits in a first access operation and selecting twice said first number of bits in a second access operation.

5. The method of claim 4, wherein said selecting a plurality of successively smaller complements of memory elements during said second series of successive access operations includes selecting a second number of bits in a first access operation and selecting half said second number of bits in a second access operation.

6. The method of claim 1, wherein said first series of successive access operations comprises a plurality of write operations.

7. The method of claim 6, wherein said second series of successive access operations comprises a plurality of write operations.

8. The method of claim 7, wherein said selecting successively larger and smaller complements of memory elements written reduces the rate of change of write current over time.

9. A method for reading data from an array of memory elements arranged in columns and rows, comprising:
   selecting a row of memory elements; and
   continuously selecting a plurality of memory elements within said selected row, said continuous selection includes selecting a first number of memory elements at a first time and a second number of memory elements at a second time, said first number differing from said second number, said continuous selection being uninterrupted by a refresh cycle.

10. The method of claim 9, wherein said second number is twice said first number.

11. The method of claim 9, wherein said selected plurality of memory elements include a phase-change memory element.

12. The method of claim 11, wherein each of said selected plurality of memory elements is a phase-change memory element.

13. The method of claim 9, further comprising:
   connecting a plurality of memory elements in said row to a plurality of sense amplifiers;
   driving a current through said plurality of memory elements in said row; and
   measuring the data values stored in said plurality of memory elements with said plurality of sense amplifiers.

14. The method of claim 13, further comprising:
   disconnecting at least one memory element of said plurality of memory elements in said row from said plurality of sense amplifiers when the voltage appearing at said at least one memory element exceeds a predetermined voltage.

15. A method for accessing a memory, comprising:
   applying a memory address to an array of phase-change memory elements, said address having a first portion and a second portion; and
   while holding said first portion of said memory address constant and without interruption by a refresh cycle:
   accessing said memory a first time;
   varying said second portion of said memory address; and
   accessing said memory a second time.

16. The method of claim 15, wherein said access at said first time comprises a read operation.

17. The method of claim 16, wherein said access at said first time further comprises a write operation.

18. The method of claim 16, wherein said access at said second time comprises a read operation.

19. The method of claim 15, wherein said array of phase change memory cells comprises:
   a plurality of phase change memory elements arranged in a plurality of columns and a plurality of rows;
   a plurality of column lines, wherein each column line connects said memory elements disposed in a particular column; and
   a plurality of column ground lines disposed in parallel with said column lines; wherein said column ground lines conduct currents from said memory elements addressed by said memory address.

* * * * *